US012622280B2

(12) United States Patent
Vincent et al.

(10) Patent No.: US 12,622,280 B2
(45) Date of Patent: May 5, 2026

(54) SEMICONDUCTOR DEVICE WITH THROUGH PACKAGE VIA AND METHOD THEREFOR

(71) Applicant: NXP USA, INC., Austin, TX (US)

(72) Inventors: Michael B. Vincent, Chandler, AZ (US); Scott M. Hayes, Chandler, AZ (US); Zhiwei Gong, Chandler, AZ (US); Leo van Gemert, Nijmegen (NL); Antonius Hendrikus Jozef Kamphuis, Nijmegen (NL); Wen Hung Huang, Kaosiung (TW)

(73) Assignee: NXP USA, INC., Austin, TX (US)

( * ) Notice: Subject to any disclaimer, the term of this patent is extended or adjusted under 35 U.S.C. 154(b) by 910 days.

(21) Appl. No.: 17/930,515

(22) Filed: Sep. 8, 2022

(65) Prior Publication Data

US 2024/0088068 A1 Mar. 14, 2024

(51) Int. Cl.
*H10W 44/20* (2026.01)
*H01P 3/06* (2006.01)
(Continued)

(52) U.S. Cl.
CPC .............. *H10W 44/20* (2026.01); *H01P 3/06* (2013.01); *H01P 11/005* (2013.01);
(Continued)

(58) Field of Classification Search
CPC ... H01L 23/66; H01L 21/565; H01L 23/3128; H01L 23/5383; H01L 23/5386;
(Continued)

(56) References Cited

U.S. PATENT DOCUMENTS 7,838,420 B2    11/2010    Tang et al.
10,249,943 B2    4/2019    Brigham
(Continued)

FOREIGN PATENT DOCUMENTS

WO    2021118803 A2    6/2021

OTHER PUBLICATIONS

Sumitomo Bakelite Co. Ltd: "Thermosetting Molding Compounds for 3D-circuit MID [Molded Interconnect Device] (Under Development)", 2 pages downloaded from https://www.sumibe.co.jp/english/solution/IoT/5G/thermosetting.html on Oct. 21, 2025.
(Continued)

*Primary Examiner* — Jacob Y Choi
*Assistant Examiner* — Neil R Prasad

(57) ABSTRACT

A method of forming a semiconductor device is provided. The method includes encapsulating with an encapsulant at least a portion of a semiconductor die and a package substrate, the encapsulant including an additive selectively activated by way of a laser. A first opening is formed in the encapsulant, the first opening exposing a predetermined first portion of the package substrate. The additive is activated at the sidewalls of the first opening. A second opening is formed in the encapsulant, the second opening encircling the first opening and exposing a predetermined second portion of the package substrate. The additive is activated at the sidewalls the second opening. A conductive material is plated on the additive activated portions of the encapsulant.

11 Claims, 14 Drawing Sheets

100

(51) Int. Cl.

| | |
|---|---|
| *H01P 11/00* | (2006.01) |
| *H01Q 1/22* | (2006.01) |
| *H01Q 9/04* | (2006.01) |
| *H10W 42/20* | (2026.01) |
| *H10W 70/60* | (2026.01) |
| *H10W 70/65* | (2026.01) |
| *H10W 70/685* | (2026.01) |
| *H10W 74/01* | (2026.01) |
| *H10W 74/10* | (2026.01) |
| *H10W 70/652* | (2026.01) |

(52) U.S. Cl.

CPC ......... *H01Q 1/2283* (2013.01); *H01Q 9/0407* (2013.01); *H10W 42/20* (2026.01); *H10W 70/611* (2026.01); *H10W 70/614* (2026.01); *H10W 70/65* (2026.01); *H10W 70/685* (2026.01); *H10W 74/016* (2026.01); *H10W 74/117* (2026.01); *H10W 44/212* (2026.01); *H10W 44/248* (2026.01); *H10W 70/6528* (2026.01)

(58) Field of Classification Search

CPC ... H01L 23/5389; H01L 23/552; H01L 24/20; H01L 2223/6622; H01L 2223/6677; H01L 2224/214; H01L 2924/3025; H01P 3/06; H01P 11/005; H01Q 1/2283; H01Q 9/0407

See application file for complete search history.

(56) References Cited

U.S. PATENT DOCUMENTS

| | | | |
|---|---|---|---|
| 10,347,598 B2 | 7/2019 | Baek et al. | |
| 10,541,464 B2 | 1/2020 | Khan et al. | |
| 2009/0057849 A1* | 3/2009 | Tang | H01L 21/6835 |
| | | | 257/664 |
| 2016/0336303 A1* | 11/2016 | Tsai | H01L 25/16 |
| 2019/0159333 A1* | 5/2019 | Sinha | H05K 1/115 |
| 2019/0198413 A1 | 6/2019 | Yook et al. | |
| 2020/0367359 A1 | 11/2020 | Baek et al. | |
| 2023/0230906 A1* | 7/2023 | Mode | H01L 24/96 |
| | | | 257/734 |

OTHER PUBLICATIONS

Three-Dimensional Circuits LPKF LDS: Laser Direct Structuring for 3D Molded Interconnect Devices, 16 pages, downloaded on https://www.lpkf.com/fileadmin/mediafiles/user_upload/products/pdf/EQ/3D-MID-LDS/brochure_lpkf_laser_direct_structuring_en.pdf on Oct. 21, 2025.

* cited by examiner

SEMICONDUCTOR DEVICE WITH THROUGH PACKAGE VIA AND METHOD THEREFOR

BACKGROUND

Field

This disclosure relates generally to semiconductor device packaging, and more specifically, to semiconductor devices with a through package via and method of forming the same.

Related Art

Today, there is an increasing trend to include sophisticated semiconductor devices in products and systems that are used every day. These sophisticated semiconductor devices may include features for specific applications which may impact the configuration of the semiconductor device packages, for example. For some features and applications, the configuration of the semiconductor device packages may be susceptible to lower reliability, lower performance, and higher product or system costs. Accordingly, significant challenges exist in accommodating these features and applications while minimizing the impact on semiconductor devices' reliability, performance, and costs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 12A and FIG. 12B through FIG. 14A and FIG. 14B illustrate, in simplified cross-sectional and corresponding plan views, example package substrate portions and semiconductor die portion of the example semiconductor devices at a stage of manufacture in accordance with embodiments.

DETAILED DESCRIPTION

Generally, there is provided, a semiconductor device with a coaxial through package via (TPV). The semiconductor device includes a semiconductor die and a package substrate at least partially encapsulated with an encapsulant. The encapsulant includes an additive capable of being activated by way of a laser in a laser direct structuring process. Openings are formed using laser ablation thus activating the encapsulant at the sidewalls of the openings. The openings are formed through the encapsulant such that predetermined conductive trace portions of the package substrate are exposed. The semiconductor device is subjected to a plating process which forms a plated signal conductor connected to a first trace in a first opening and a plated concentric shield conductor connected to a second trace in a second opening. The shield conductor is connected to a ground voltage supply terminal and surrounds the signal conductor to form the coaxial TPV connected to traces of the package substrate. By forming the semiconductor device with the coaxial TPV in this manner, low loss RF signal propagation can be realized with lower product costs.

Figure 1:
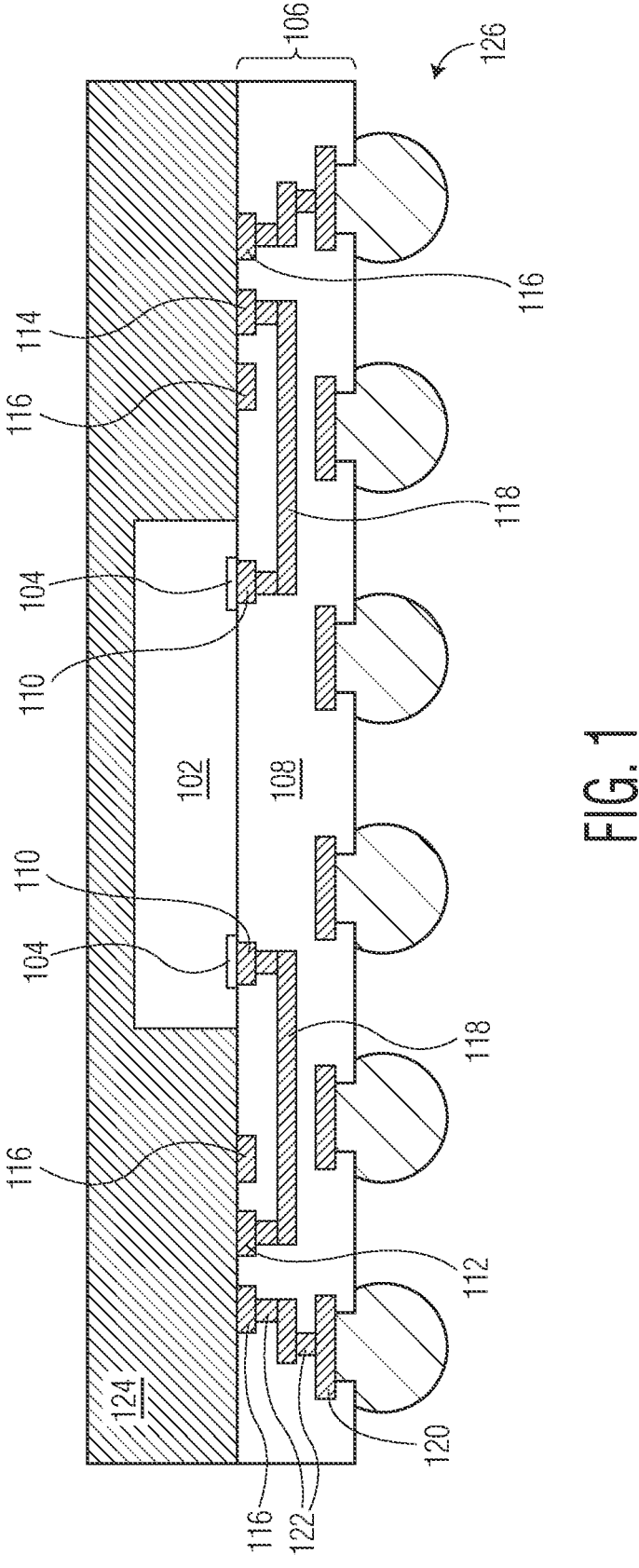
FIG. 1 through FIG. 6 illustrate, in simplified cross-sectional views, an example semiconductor device having a coaxial through package via (TPV) at stages of manufacture in accordance with an embodiment.

FIG. 1 illustrates, in a simplified cross-sectional view, an example semiconductor device 100 having a coaxial through package via (TPV) at a stage of manufacture in accordance with an embodiment. The term "through package via" or "TPV," as used herein, generally refers to a vertical via formed through at least a portion of an encapsulant of the semiconductor device. At this stage of manufacture, the semiconductor device 100 includes a semiconductor die 102 and a package substrate 106 partially encapsulated with an encapsulant 124. In this embodiment, the encapsulant 124 is an epoxy molding compound which includes a chemical additive (e.g., copper chromate) capable of being activated by way of a laser in a laser direct structuring process. For example, when activated, a chemical reaction is initiated causing the activated portion of the encapsulant to form metal particles sufficient to serve as a seed layer for electroless plating (e.g., copper).

The semiconductor die 102 has an active side (e.g., major side having circuitry) and a backside (e.g., major side opposite of the active side). The semiconductor die 102 includes die pads 104 formed at the active side. Die pads 104 may be configured for connection to respective signal conductor (formed at a subsequent stage) by way of the package substrate, for example. In this embodiment, semiconductor die 102 is configured in an active-side-down orientation with die pads 104 connected to conductive features of the package substrate 106. The term "conductive," as used herein, generally refers to electrical conductivity unless otherwise specified. The semiconductor die 102 may be formed from any suitable semiconductor material, such as silicon, germanium, gallium arsenide, gallium nitride, and the like. The semiconductor die 102 may further include digital circuits, analog circuits, RF circuits, power circuits, memories, processors, the like, and combinations thereof at the active side.

The package substrate 106 includes conductive features (e.g., traces 110-120 and vias 122) surrounded by non-conductive material 108 (e.g., dielectric). The conductive traces 110-120 and vias 122 of the package substrate 106 are configured to interconnect the semiconductor die 102 with the signal conductor (formed at a subsequent stage) and a printed circuit board (PCB), for example. In this embodiment, the traces 112 and 114 are configured for direct connection of respective signal conductors formed at a subsequent stage of manufacture. The traces 116 substantially encircle each of the traces 112 and 114 and are configured for direct connection of respective shield conductors formed at a subsequent stage of manufacture. The traces 116 are further configured for connection to ground voltage supply terminal by way of the package substrate 106, for example.

The package substrate 106 may be formed as a build-up substrate or may be provided as a pre-formed substrate. Conductive connectors 126 (e.g., solder balls) are affixed at a bottom side of the package substrate 106. Openings in the non-conductive material 108 expose portions of traces 120 configured for attachment of the conductive connectors 126. The conductive connectors 126 may be in the form of suitable conductive structures such as solder balls, gold studs, copper pillars, and the like, to connect conductive features of the semiconductor device 100 with the PCB. As an alternative to attaching conductive connectors 126, the exposed portions of conductive traces 120 may be plated for subsequent connection with the PCB by way of solder paste attachment or other suitable conductive attachment processes (e.g., ACF, ACP). The number and arrangement of the conductive connectors 126 and the routing of the conductive traces 110-120 in this embodiment are chosen for illustration purposes. In some embodiments, fiducial elements (not shown) may be included at a top surface of the encapsulant to allow accurate alignment of a laser tool with embedded features of the semiconductor device. For example, structures can be placed along with the semiconductor die 102, molded, and revealed at the top surface.

Figure 2:
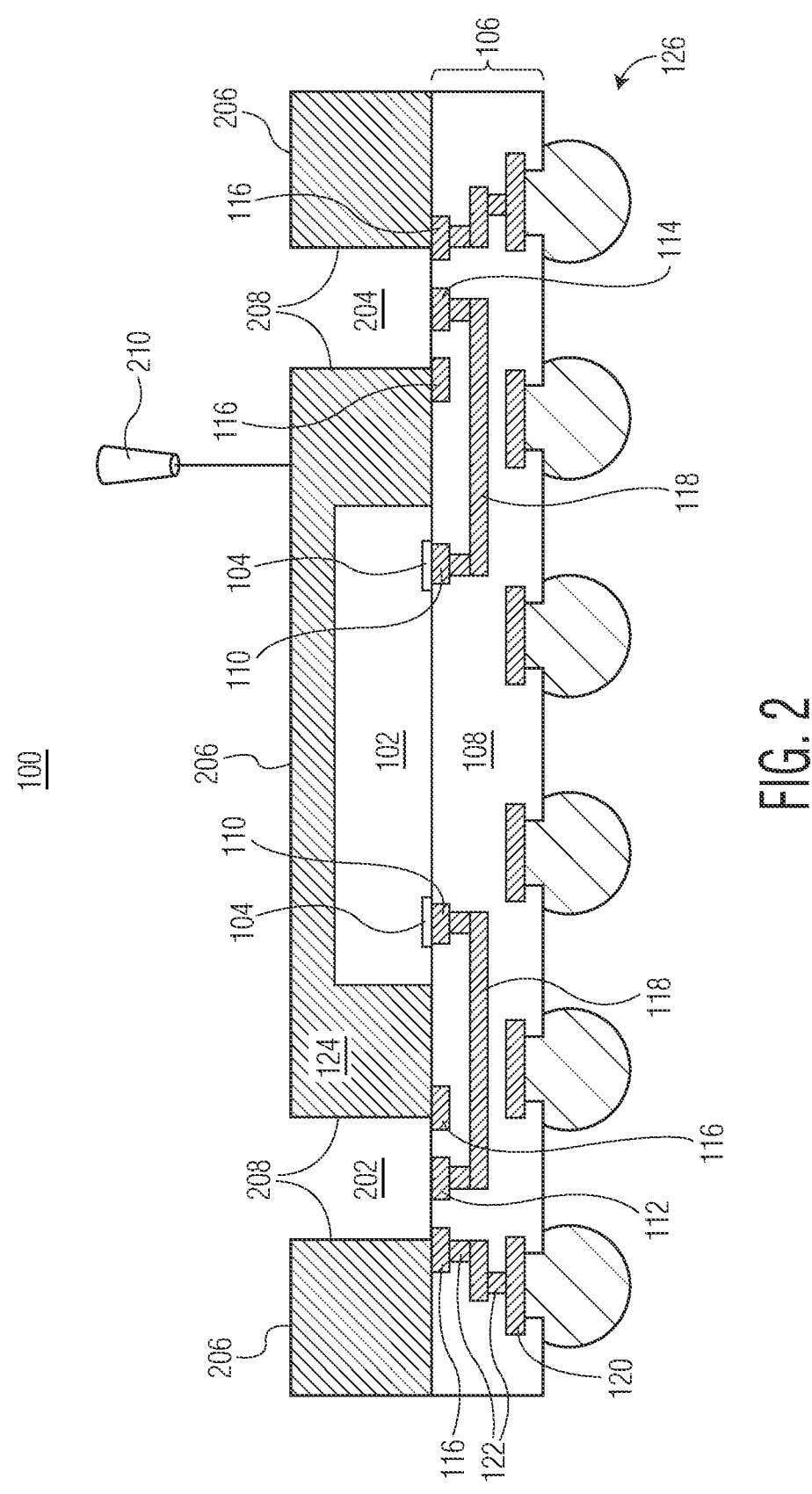

FIG. 2 illustrates, in a simplified cross-sectional view, the example semiconductor device 100 at a subsequent stage of manufacture in accordance with an embodiment. At this stage, the semiconductor device 100 includes openings 202 and 204 and patterned paths at the top surface 206 of the encapsulant 124 formed by a laser 210. In this embodiment, the through encapsulant openings 202 and 204 expose predetermined portions of the package substrate 106. For example, portions of traces 112 and 116 are exposed through opening 202 and portions of traces 114 and 116 are exposed through opening 204. By forming the openings 202 and 204 by way of laser ablation, the additive of the encapsulant 124 is activated at the sidewalls 208 causing a thin conductive lining to be formed at the sidewalls of the openings. Likewise, by forming the patterned paths at the top surface 206 by way of laser ablation, the additive of the encapsulant 124 is activated in the laser ablated paths causing thin conductive patterned paths to be formed at the top surface. The activated sidewalls 208 and activated patterned paths at the top surface 206 of the encapsulant 124 serve as a catalyst (e.g., seed layer) for electroless plating at a subsequent stage of manufacture.

Figure 3:
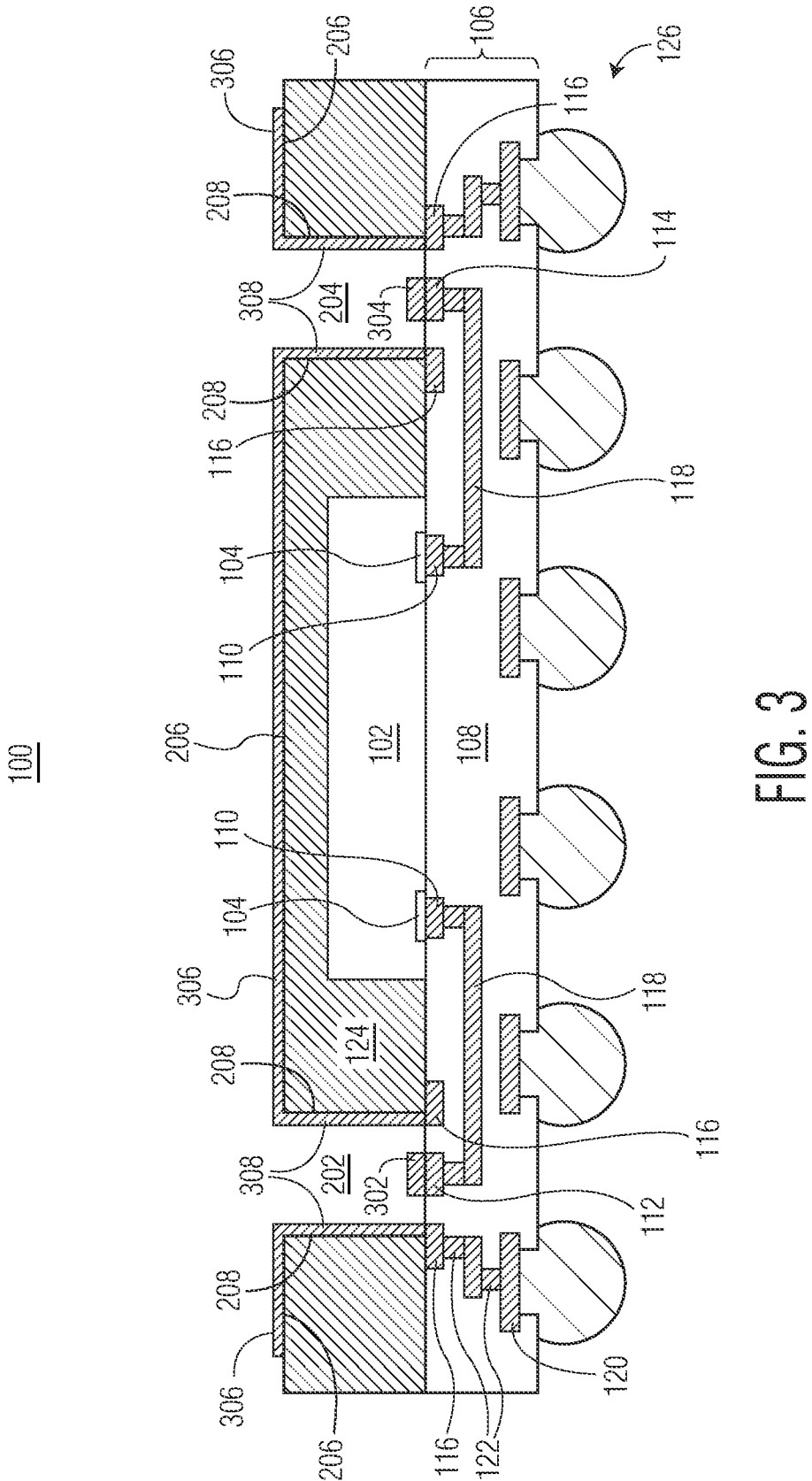

FIG. 3 illustrates, in a simplified cross-sectional view, the example semiconductor device 100 at a subsequent stage of manufacture in accordance with an embodiment. At this stage, the semiconductor device 100 includes a conductive material (e.g., copper) layer formed on the activated sidewalls 208 of the openings 202 and 204, activated patterned paths at the top surface 206 of the encapsulant 124, and exposed portions of the conductive traces 112-116. The conductive material layer includes conductive trace portions 302-308 formed on activated regions of the encapsulant 124. In this embodiment, the semiconductor device is subjected to an electroless plating operation to form the conductive material layer on the activated sidewalls 208, the activated patterned paths, and exposed portions of the conductive traces 112-116. The conductive material layer portions (302, 304) formed on the exposed portions of conductive traces 112 and 114 serve as conductive trace extensions 302 and 304 for the respective signal conductors formed at a subsequent stage, for example.

The vertical portion of the conductive material layer forms a concentric shield conductor 308 at the sidewalls 208 and exposed portions of the conductive traces 116. The horizontal portion of the conductive material layer forms conductive trace 306 connected to the shield conductor 308. In this embodiment, the conductive trace 306 is substantially perpendicular to the shield conductor 308 and overlaps at least a portion of the semiconductor die 102. The conductive trace 306 may have a shape sufficient to serve as an electromagnetic interference (EMI) shield over the semiconductor die 102. For example, the conductive trace 306 may be shaped as a plate substantially covering the top surface 206 of the encapsulant 124 thereby preventing signal radiation (e.g., EMI) from interfering with the operation of the underlying semiconductor die 102. In this embodiment, the conductive trace 306 and the shield conductor 308 are configured for interconnection to a ground voltage supply terminal by way the package substrate 106.

Figure 4:
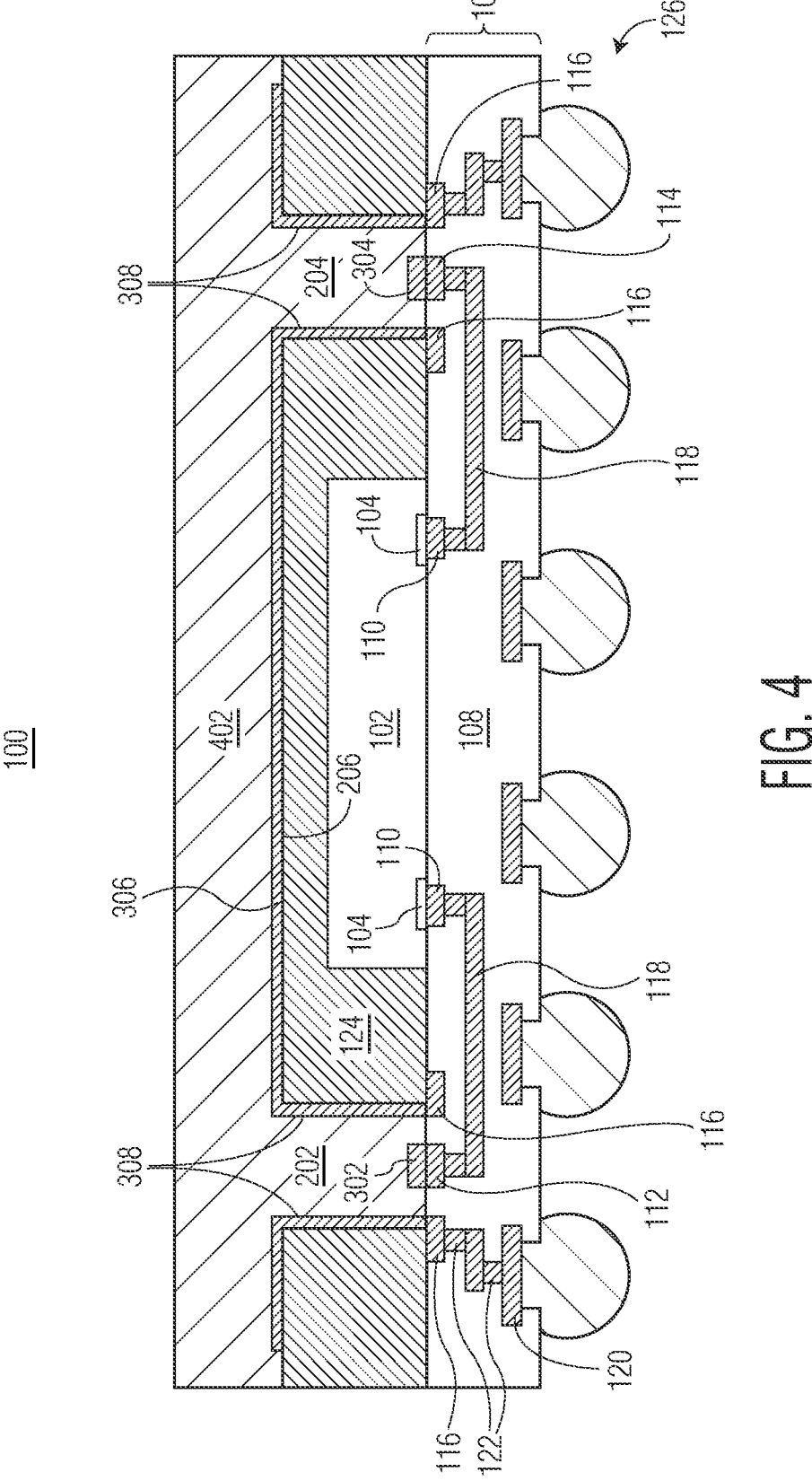

FIG. 4 illustrates, in a simplified cross-sectional view, the example semiconductor device 100 at a subsequent stage of manufacture in accordance with an embodiment. At this stage, the semiconductor device 100 includes the openings 202 and 204 and the conductive traces 302-308 encapsulated with a second encapsulant 402. In this embodiment, the encapsulant 402 is an epoxy molding compound which includes a chemical additive capable of being activated by way of a laser in a laser direct structuring process. The openings 202 and 204, conductive traces 302-308, and exposed portions of the top surface 206 of the encapsulant 124 are over-molded with the encapsulant 402 by way of a molding process. In this embodiment, the encapsulant 402 may be characterized as a low loss tangent material having a dissipation factor (Df) property less than or equal to 0.01.

Figure 5:
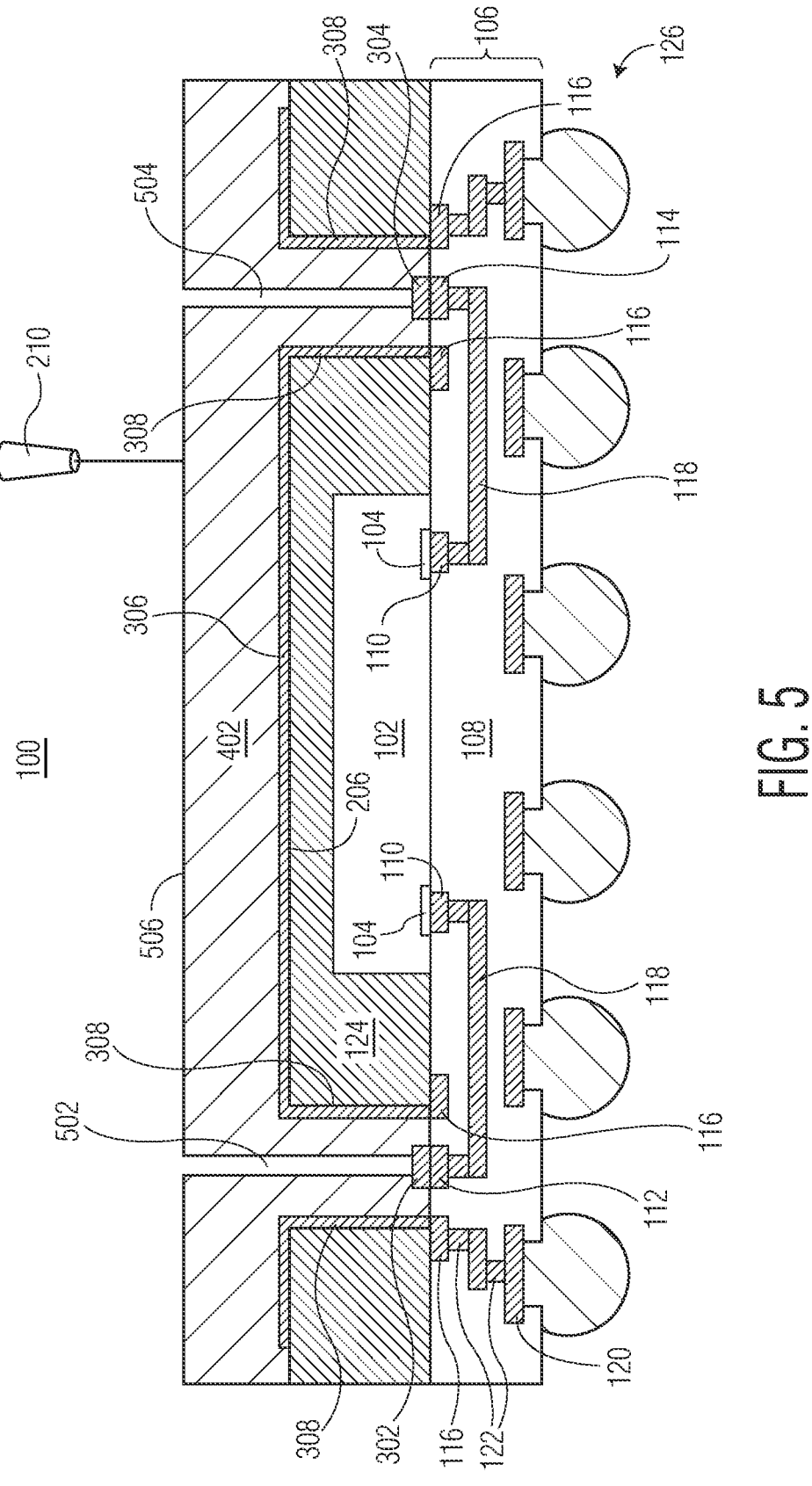

FIG. 5 illustrates, in a simplified cross-sectional view, the example semiconductor device 100 at a subsequent stage of manufacture in accordance with an embodiment. At this stage, the semiconductor device 100 includes openings 502 and 504 and patterned paths at the top surface 506 of the encapsulant 402 formed by the laser 210. In this embodiment, the through encapsulant openings 502 and 504 expose predetermined portions of the conductive trace extensions 302 and 304 formed on traces 112 and 114 of the package substrate 106. For example, portions of traces 302 and 304 are exposed through respective openings 502 and 504. By forming the openings 502 and 504 by way of laser ablation, the additive of the encapsulant 402 is activated at the sidewalls of the openings causing a thin conductive lining to be formed. Likewise, by forming the patterned paths at the top surface 506 by way of laser ablation, the additive of the encapsulant 402 is activated in the laser ablated paths causing thin conductive patterned paths to be formed at the top surface. The activated sidewalls and activated patterned paths at the top surface 506 of the encapsulant 402 serve as a catalyst (e.g., seed layer) for electroless plating at a subsequent stage of manufacture.

Figure 6:
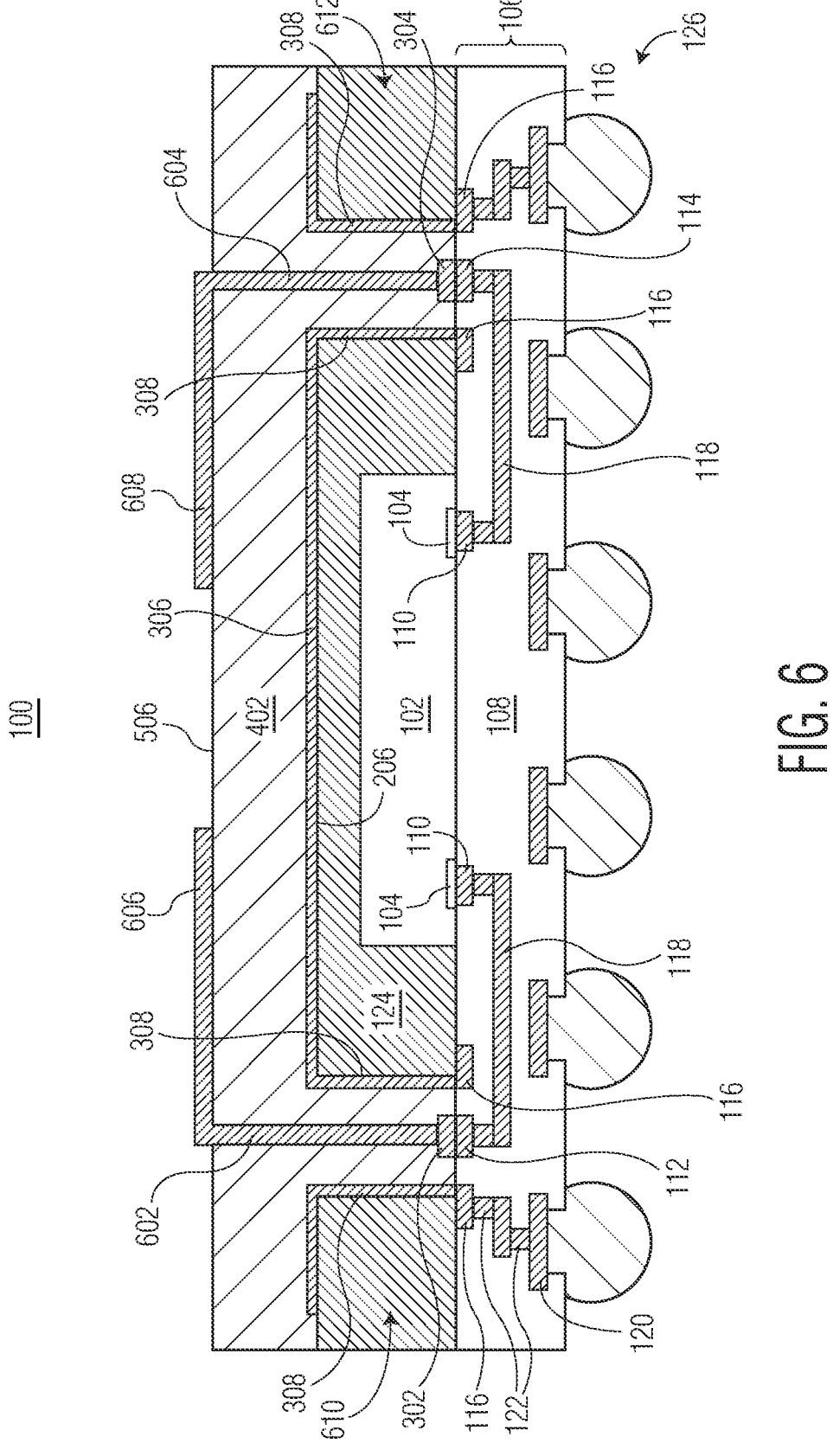

FIG. 6 illustrates, in a simplified cross-sectional view, the example semiconductor device 100 at a subsequent stage of manufacture in accordance with an embodiment. At this stage, the semiconductor device 100 includes a second conductive material (e.g., copper) layer formed on the activated sidewalls of the openings 502 and 504 (FIG. 5) and activated patterned paths at the top surface 506 of the encapsulant 402. The second conductive material layer includes conductive trace portions 602-608 formed on activated regions of the encapsulant 402. In this embodiment, the semiconductor device is subjected to a second electroless plating operation to form the conductive material layer on the activated sidewalls, the activated patterned paths, and exposed portions of the conductive traces 302 and 304.

The vertical portions of the second conductive material layer forms respective plated signal conductors 602 and 604 which have first ends connected to traces 112 and 114 by way of extended traces 302 and 304 and second ends exposed through the top surface 506 of the encapsulant 402. The horizontal portions of the second conductive material layer forms plated conductors 606 and 608 connected to the respective signal conductors 602 and 604. The plated conductors 606 and 608 are substantially perpendicular to the respective signal conductors 602 and 604 and overlap at least a portion of the conductive trace 306. In this embodiment, each of the plated conductors 606 and 608 may be configured as a radiating element such as a radio frequency (RF) signal launcher or a signal antenna. The plated conductors 606 and 608 are interconnected to the semiconductor die 102 by way of conductive traces 118 of the package substrate 106, for example. Therefore, it may be desirable to minimize the thickness of the encapsulant 402 to reduce the length of the non-coax portion of the vertical signal conductors 602 and 604.

In this embodiment, each of the signal conductors 602 and 604 is surrounded by a respective shield conductor 308 to form a coaxial TPV portion (610, 612). A portion of the encapsulant 402 serves as a dielectric separating the signal conductors 602 and 604 from the respective shield conductors 308. Therefore, it may be desirable for the encapsulant 402 to be formed as a low loss material having a Df property less than or equal to 0.01 to minimize signal loss. Because of the formed coaxial TPV portions 610 and 612 and the conductive shield 306 over the semiconductor die 102, EMI radiation from the semiconductor die 102 is prevented from interfering with signals transmitted or received by way of radiating elements (e.g., plated conductors 606 and 608). Likewise, signals transmitted or received by way of radiating elements are prevented from interfering with the operation of the underlying semiconductor die 102.

Figure 7:
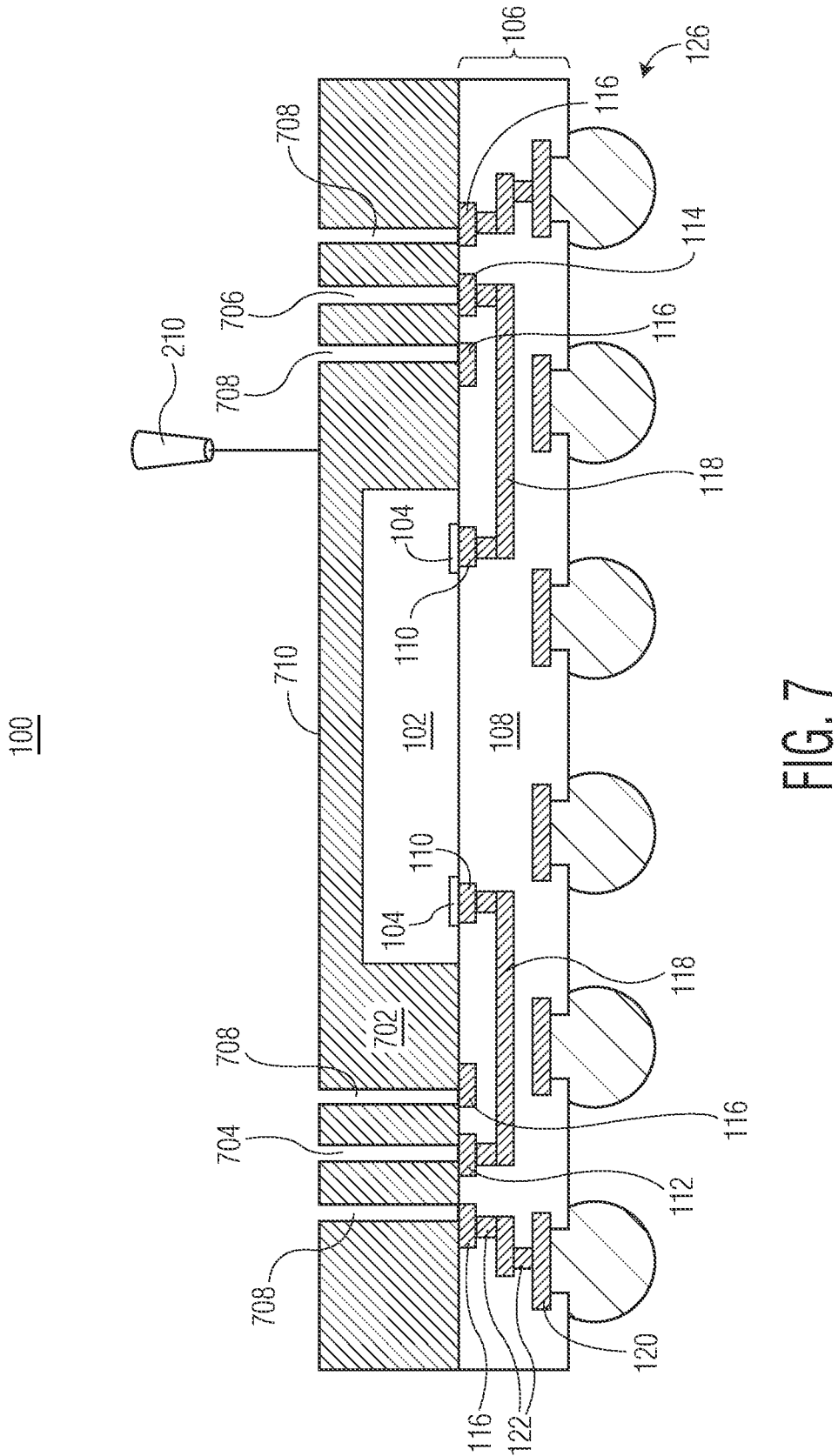
FIG. 7 through FIG. 9 illustrate, in simplified cross-sectional views, the example semiconductor device at alternative stages of manufacture in accordance with an embodiment.
Figure 8:
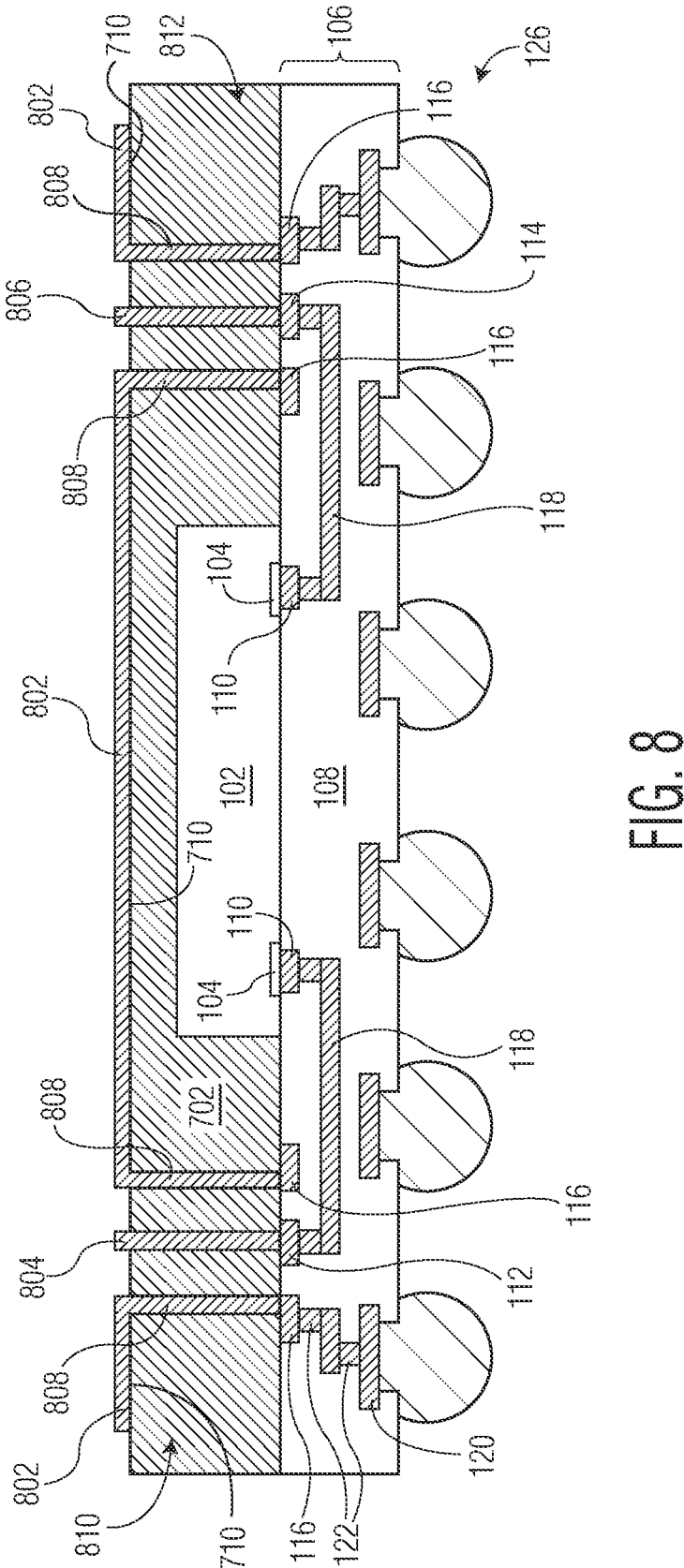
Figure 9:
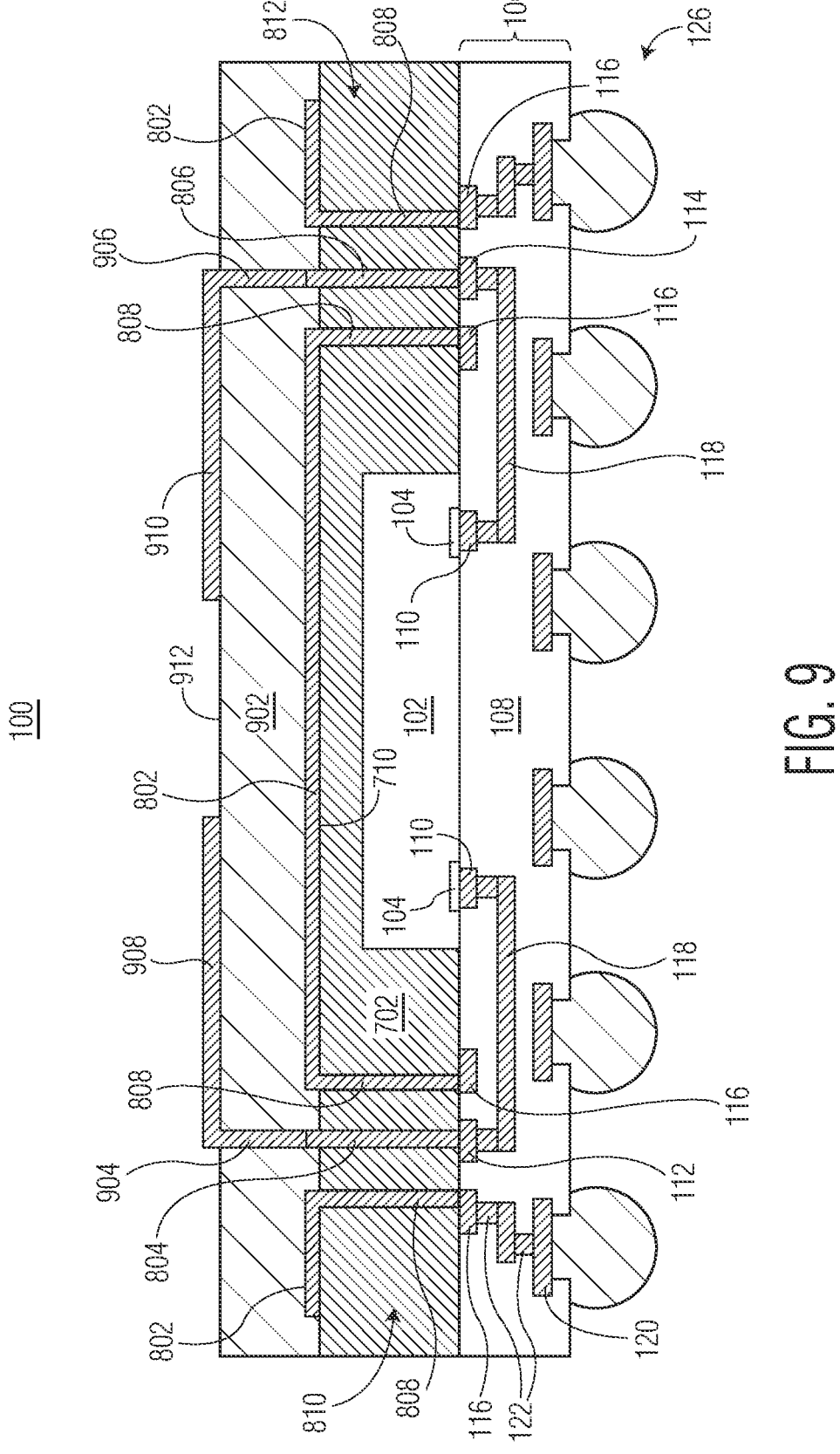

FIG. 7 through FIG. 9 illustrate, in simplified cross-sectional views, the example semiconductor device 100 at alternative stages of manufacture in accordance with an embodiment. The stages of manufacture depicted in FIG. 7 through FIG. 9 are an alternative to the stages of manufacture of the example semiconductor device 100 depicted in FIG. 2 through FIG. 6.

FIG. 7 illustrates, in a simplified cross-sectional view, the example semiconductor device 100 at an alternative stage of manufacture in accordance with an embodiment. At this stage, the example semiconductor device 100 includes openings 704-708 and patterned paths at the top surface 710 of the encapsulant 702 formed by the laser 210. In this embodiment, the encapsulant 702 is an epoxy molding compound which includes a chemical additive (e.g., copper chromate) capable of being activated by way of a laser in a laser direct structuring process. The through encapsulant openings 704-708 expose predetermined portions of the package substrate 106. For example, portions of traces 112 and 114 are exposed through respective openings 704 and 706 and portions of traces 116 are exposed through openings 708. By forming the openings 704-708 by way of laser ablation, the additive of the encapsulant 702 is activated at the sidewalls of the openings causing a thin conductive lining to be formed. Likewise, by forming the patterned paths at the top surface 710 by way of laser ablation, the additive of the encapsulant 702 is activated in the laser ablated paths causing thin conductive patterned paths to be formed at the top surface. The activated sidewalls and activated patterned paths at the top surface 710 of the encapsulant 702 serve as a catalyst (e.g., seed layer) for electroless plating at a subsequent stage of manufacture.

FIG. 8 illustrates, in a simplified cross-sectional view, the example semiconductor device 100 at a subsequent stage of manufacture in accordance with an embodiment. At this stage, the semiconductor device 100 includes a conductive material (e.g., copper) layer formed on the activated sidewalls of the openings 704-708, activated patterned paths at the top surface 710 of the encapsulant 702, and exposed portions of the conductive traces 112-116. The conductive material layer includes conductive trace portions 802-808 formed on activated regions of the encapsulant 702. In this embodiment, the semiconductor device 100 is subjected to an electroless plating operation to form the conductive material layer on the activated sidewalls, the activated patterned paths, and exposed portions of the conductive traces 112-116.

The vertical portions of the conductive material layer plated in openings 704 and 706 (FIG. 7) form respective plated signal conductors 804 and 806 which have first ends connected to traces 112 and 114 of the package substrate 106 and second ends exposed through the top surface 710 of the encapsulant 702. The vertical portions of the conductive material layer plated in openings 708 (FIG. 7) form concentric shield conductors 808 connected to conductive traces 116 of the package substrate 106. The horizontal portions of the conductive material layer plated on the activated patterned paths at the top surface 710 form a conductive trace (e.g., plate) 802 connected to the shield conductor 808. In this embodiment, the conductive trace 802 is substantially perpendicular to the shield conductors 808 and overlaps at least a portion of the semiconductor die 102. The conductive trace 802 may be configured with a shape sufficient to serve as an EMI shield over the semiconductor die 102. For example, the conductive trace 802 may formed as a rectilinear shape substantially covering the top surface 710 of the encapsulant 702 thereby preventing signal radiation (e.g., EMI) from interfering with the operation of the underlying semiconductor die 102. In this embodiment, the conductive trace 802 and the shield conductors 808 are configured for interconnection to a ground voltage supply terminal by way of the package substrate 106.

In this embodiment, each of the signal conductors 804 and 806 is surrounded by a respective shield conductor 808 to form a coaxial TPV portion (810, 812). A portion of the encapsulant 702 serves as a dielectric separating the signal conductors 804 and 806 from the respective shield conductors 808. Therefore, it may be desirable for the encapsulant 702 to be formed as a low loss material having a Df property less than or equal to 0.01 to minimize signal loss.

FIG. 9 illustrates, in a simplified cross-sectional view, the example semiconductor device 100 at a subsequent stage of manufacture in accordance with an embodiment. At this stage, the semiconductor device 100 includes at least a top side portion encapsulated with a second encapsulant 902 and conductive traces 904-910 formed on the encapsulant 902. In this embodiment, the encapsulant 902 is an epoxy molding compound which includes a chemical additive capable of being activated by way of a laser in a laser direct structuring process. The exposed portions of the conductive traces 802-804 and exposed portions of the top surface 710 of the encapsulant 702 are over-molded with the encapsulant 902 by way of a molding process. In this embodiment, the encapsulant 902 may be characterized as a low loss tangent material having a dissipation factor (Df) property less than or equal to 0.01.

After encapsulating with the encapsulant 902, openings through the encapsulant exposing predetermined portions of the signal conductors 804 and 806 and patterned paths at the top surface 912 of the encapsulant 902 are formed by way of the laser. Thin conductive linings are formed at the sidewalls of the openings and thin conductive patterned paths are formed at the top surface 912 by way of the laser induced additive activation. A second conductive material (e.g., copper) layer is plated on the activated sidewalls of the openings and activated patterned paths at the top surface 912 of the encapsulant 902.

The vertical portions of the second conductive material layer forms respective plated signal conductors 904 and 906 which have first ends connected to signal conductors 804 and 806 and second ends exposed through the top surface 912 of the encapsulant 902. The horizontal portions of the second conductive material layer forms plated conductors 908 and 910 connected to the respective signal conductors 904 and 906. The plated conductors 908 and 910 are substantially perpendicular to the respective signal conductors 904 and 906 and overlap at least a portion of the conductive trace 802. In this embodiment, each of the plated conductors 908 and 910 may be configured as a radiating element such as an RF signal launcher or a signal antenna. The plated conductors 908 and 910 are configured for interconnection to the semiconductor die 102 by way of a conductive traces 118 of the package substrate 106, for example.

Figure 10:
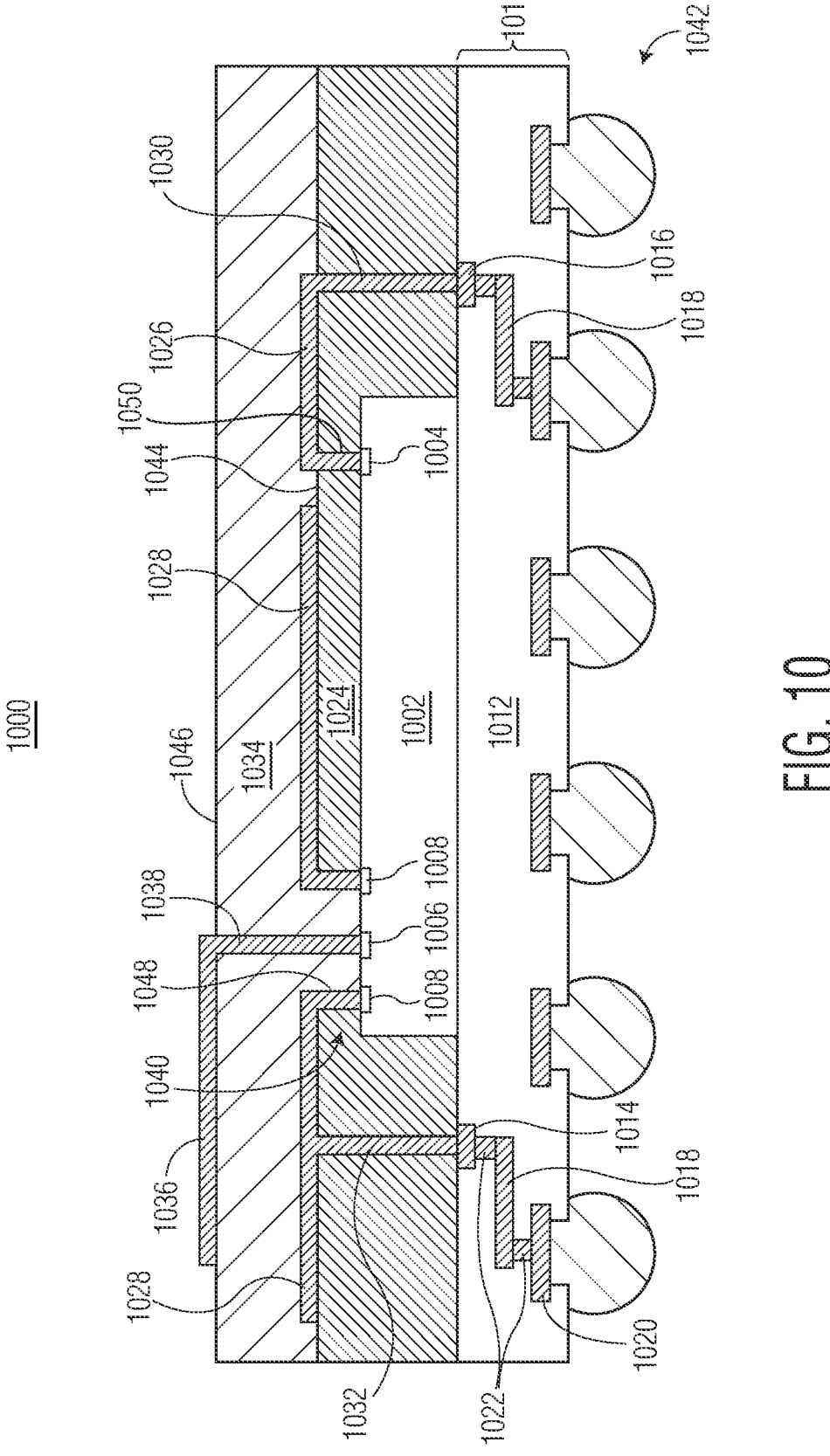
FIG. 10 through FIG. 11 illustrate, in simplified cross-sectional views, alternative example semiconductor devices with a semiconductor die in an active-side-up orientation at a stage of manufacture in accordance with an embodiment.
Figure 11:
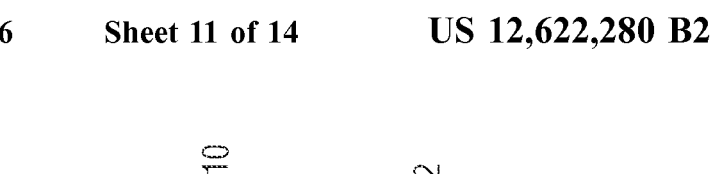

FIG. 10 through FIG. 11 illustrate, in simplified cross-sectional views, alternative example semiconductor devices with a semiconductor die in an active-side-up orientation at a stage of manufacture in accordance with an embodiment. The example semiconductor devices 1000 and 1100 depicted in FIG. 10 and FIG. 11 respectively are alternative embodiments of the example semiconductor device 100 depicted at various stages of manufacture in FIG. 1 through FIG. 9, for example.

FIG. 10 illustrates, in a simplified cross-sectional view, an example semiconductor device 1000 having a coaxial TPV at a stage of manufacture in accordance with an embodiment. At this stage of manufacture, the semiconductor device 1000 includes a semiconductor die 1002 and a package substrate 1010 partially encapsulated with a first encapsulant 1024 and a second encapsulant 1034. In this embodiment, each of the encapsulants 1024 and 1034 is an epoxy molding compound which includes a chemical additive capable of being activated by way of a laser in a laser direct structuring process.

The semiconductor die 1002 has an active side (e.g., major side having circuitry) and a backside (e.g., major side opposite of the active side). The semiconductor die 1002 includes die pads 1004-1008 formed at the active side. In this embodiment, semiconductor die 1002 is configured in an active-side-up orientation. The semiconductor die 1002 may be formed from any suitable semiconductor material, such as silicon, germanium, gallium arsenide, gallium nitride, and the like. The semiconductor die 1002 may further include digital circuits, analog circuits, RF circuits, power circuits, memories, processors, the like, and combinations thereof at the active side.

The package substrate 1010 includes conductive features (e.g., traces 1014-1020 and vias 1022) surrounded by non-conductive material 1012 (e.g., dielectric). The conductive traces 1014-1020 and vias 1022 of the package substrate 1010 are configured to interconnect the semiconductor die 1002 with a PCB, for example. The package substrate 1010 may be formed as a build-up substrate or may be provided as a pre-formed substrate. Conductive connectors 1042 (e.g., solder balls) are affixed at a bottom side of the package substrate 1010. Openings in the non-conductive material 1012 expose portions of traces 1020 configured for attachment of the conductive connectors 1042. The conductive connectors 1042 may be in the form of suitable conductive structures such as solder balls, gold studs, copper pillars, and the like, to connect conductive features of the semiconductor device 1000 with the PCB.

Openings through the first encapsulant 1024 and patterned paths at the top surface 1044 of the encapsulant 1024 are formed by a laser. The laser activated additive of the first encapsulant 1024 is plated in a first electroless plating process to form a first conductive material (e.g., copper) layer on the activated sidewalls of the openings and activated patterned paths at the top surface 1044 of the encapsulant 1024. A first vertical portion of the first conductive material layer forms plated TPVs 1030 and 1032 through the encapsulant 1024. A first end of each of the TPVs 1030 and 1032 is connected to respective traces 1014 and 1016 of the package substrate 1010. A second vertical portion of the first conductive material layer forms a concentric shield conductor 1048 through the encapsulant 1024. A first end of the shield conductor 1048 is connected to respective die pads 1008 at the active side of the semiconductor die 1002. A first horizontal portion of the conductive material layer forms a conductive trace 1028 connected to a second end of the shield conductor and to the TPV 1032. In this embodiment, the conductive trace 1028 is substantially perpendicular to the shield conductor 1048 and TPV 1032 and overlaps at least a portion of the semiconductor die 1002. The conductive trace 1028 may be formed in a shape sufficient to serve as an EMI shield at the top surface 1044 of the encapsulant 1024. A third vertical portion of the first conductive material layer forms a TPV 1050 through the encapsulant 1024 having a first end connected a die pad 1004 at the active side of the semiconductor die 1002. A second horizontal portion of the conductive material layer forms a conductive trace 1026 interconnecting a second end of the TPV 1050 and a second end of TPV 1030.

Openings through the second encapsulant 1034 and patterned paths at the top surface 1046 of the encapsulant 1034 are formed by the laser. The laser activated additive of the second encapsulant 1034 is plated in a second electroless plating process to form a second conductive material (e.g., copper) layer on the activated sidewalls of the openings and activated patterned paths at the top surface 1046 of the encapsulant 1034. A vertical portion of the second conductive material layer forms plated signal conductor 1038 which has first end connected to die pad 1006 and a second end exposed through the top surface 1046 of the encapsulant 1034. A horizontal portion of the second conductive material layer forms a plated conductor 1036 connected to the second end of the signal conductor 1038. The plated conductor 1036 is substantially perpendicular to the signal conductor 1038 and overlaps at least a portion of the conductive trace 1028. In this embodiment, the plated conductor 1036 may be configured as a radiating element such as an RF signal launcher or a signal antenna.

In this embodiment, the signal conductor 1038 is surrounded by the shield conductor 1048 to form a coaxial TPV portion 1040. A portion of the encapsulant 1034 serves as a dielectric separating the signal conductor 1038 from the shield conductor 1048. Therefore, it may be desirable for the encapsulant 1034 to be formed as a low loss material having a Df property less than or equal to 0.01 to minimize signal loss. Because of the formed coaxial TPV portion 1040 and the conductive shield 1028 over the semiconductor die 1002, EMI radiation from the semiconductor die 1002 is prevented from interfering with signals transmitted or received by way of radiating elements (e.g., plated conductor 1036). Likewise, signals transmitted or received by way of radiating elements are prevented from interfering with the operation of the underlying semiconductor die 1002.

FIG. 11 illustrates, in a simplified cross-sectional view, an alternative example semiconductor device 1100 having a coaxial TPV at a stage of manufacture in accordance with an embodiment. At this stage of manufacture, the semiconductor device 1100 includes a semiconductor die 1102 and a package substrate 1110 partially encapsulated with a first encapsulant 1126 and a second encapsulant 1134. In this embodiment, each of the encapsulants 1126 and 1134 is an epoxy molding compound which includes a chemical additive capable of being activated by way of a laser in a laser direct structuring process. The example semiconductor device 1100 of the embodiment depicted in FIG. 11 is an alternative to the semiconductor device 1000 of the embodiment depicted in FIG. 10. The embodiment of FIG. 11 includes a bond wire interconnecting the die pad 1104 of the semiconductor die 1102 with the package substrate 1110 whereas the embodiment of FIG. 10 includes a series of plated conductors (e.g., 1050, 1026, 1030) to interconnect the die pad 1004 with the package substrate 1010.

The semiconductor die 1102 has an active side (e.g., major side having circuitry) and a backside (e.g., major side opposite of the active side). The semiconductor die 1102 includes die pads 1104-1108 formed at the active side. In this embodiment, semiconductor die 1102 is configured in an active-side-up orientation. The semiconductor die 1102 may be formed from any suitable semiconductor material, such as silicon, germanium, gallium arsenide, gallium nitride, and the like. The semiconductor die 1002 may further include digital circuits, analog circuits, RF circuits, power circuits, memories, processors, the like, and combinations thereof at the active side.

The package substrate 1110 includes conductive features (e.g., traces 1114-1120 and vias 1122) surrounded by non-conductive material 1112 (e.g., dielectric). The conductive traces 1114-1120 and vias 1122 of the package substrate 1110 are configured to interconnect the semiconductor die 1102 with a PCB, for example. The package substrate 1110 may be formed as a build-up substrate or may be provided as a pre-formed substrate. Conductive connectors 1142 (e.g., solder balls) are affixed at a bottom side of the package substrate 1110. Openings in the non-conductive material 1112 expose portions of traces 1120 configured for attachment of the conductive connectors 1142. The conductive connectors 1142 may be in the form of suitable conductive structures such as solder balls, gold studs, copper pillars, and the like, to connect conductive features of the semiconductor device 1100 with the PCB. In this embodiment, the semiconductor die 1102 is in part interconnected with the package substrate 1110 by way of a bond wire. The bond wire 1124 has a first end connected to the die pad 1104 of the semiconductor die 1102 and a second end connected to the trace 1116 of the package substrate 1110.

Openings through the first encapsulant 1126 and patterned paths at the top surface 1144 of the encapsulant 1126 are formed by a laser. The laser activated additive of the first encapsulant 1126 is plated in a first electroless plating process to form a first conductive material (e.g., copper) layer on the activated sidewalls of the openings and activated patterned paths at the top surface 1144 of the encapsulant 1126. A first vertical portion of the first conductive material layer forms plated TPV 1132 through the encapsulant 1126. A first end of the TPV 1132 is connected to trace 1114 of the package substrate 1110. A second vertical portion of the first conductive material layer forms a concentric shield conductor 1148 through the encapsulant 1126. A first end of the shield conductor 1148 is connected to die pads 1108 at the active side of the semiconductor die 1102. A horizontal portion of the conductive material layer forms a conductive trace 1128 connected to a second end of the shield conductor 1148 and to the TPV 1132. In this embodiment, the conductive trace 1128 is substantially perpendicular to the shield conductor 1148 and TPV 1132 and overlaps at least a portion of the semiconductor die 1102. The conductive trace 1128 may be formed in a shape sufficient to serve as an EMI shield at the top surface 1144 of the encapsulant 1126.

Openings through the second encapsulant 1134 and patterned paths at the top surface 1146 of the encapsulant 1134 are formed by the laser. The laser activated additive of the second encapsulant 1134 is plated in a second electroless plating process to form a second conductive material (e.g., copper) layer on the activated sidewalls of the openings and activated patterned paths at the top surface 1146 of the encapsulant 1134. A vertical portion of the second conductive material layer forms plated signal conductor 1138 which has first end connected to die pad 1106 and a second end exposed through the top surface 1146 of the encapsulant 1134. A horizontal portion of the second conductive material layer forms a plated conductor 1136 connected to the second end of the signal conductor 1138. The plated conductor 1136 is substantially perpendicular to the signal conductor 1138 and overlaps at least a portion of the conductive trace 1128. In this embodiment, the plated conductor 1136 may be configured as a radiating element such as an RF signal launcher or a signal antenna.

In this embodiment, the signal conductor 1138 is surrounded by the shield conductor 1148 to form a coaxial TPV portion 1140. A portion of the encapsulant 1134 serves as a dielectric separating the signal conductor 1138 from the shield conductor 1148. Therefore, it may be desirable for the encapsulant 1134 to be formed as a low loss material having a Df property less than or equal to 0.01 to minimize signal loss. Because of the formed coaxial TPV portion 1140 and the conductive shield 1128 over the semiconductor die 1102, EMI radiation from the semiconductor die 1102 is prevented from interfering with signals transmitted or received by way of radiating elements (e.g., plated conductor 1136). Likewise, signals transmitted or received by way of radiating elements are prevented from interfering with the operation of the underlying semiconductor die 1102.

FIG. 12A and FIG. 12B through FIG. 14A and FIG. 14B illustrate, in simplified cross-sectional and corresponding plan views, example package substrate portions and semiconductor die portion of the example semiconductor devices (100, 1000, 1100) at a stage of manufacture in accordance with embodiments.

Figure 12B:
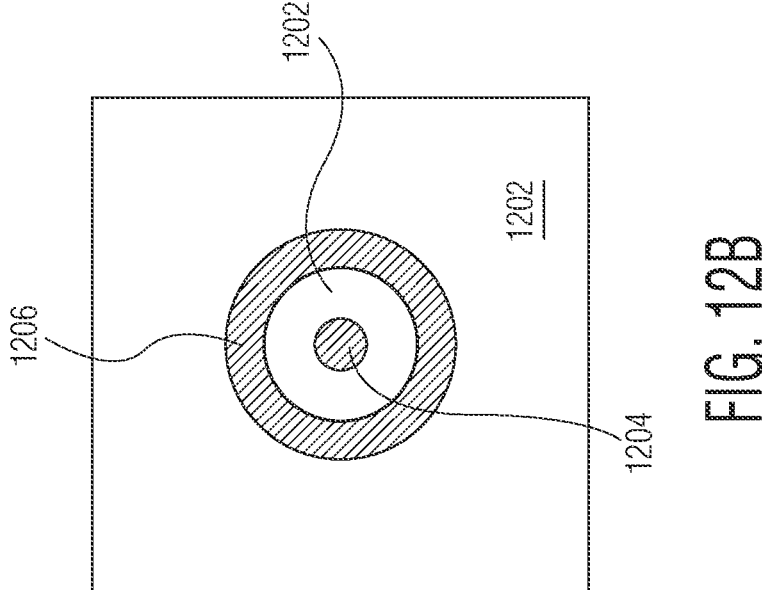
Figure 12A:
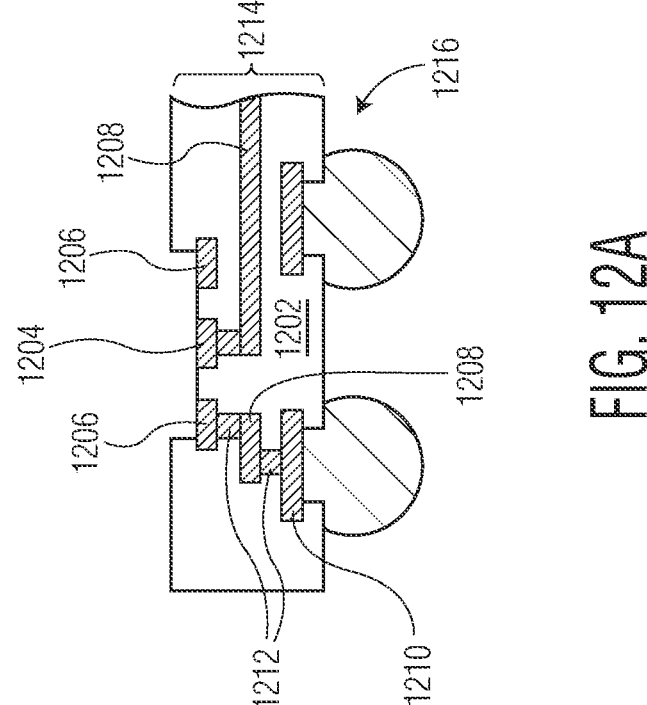

FIG. 12A and FIG. 12B illustrate, in simplified plan and cross-sectional focused views, the example semiconductor device 100 at a stage of manufacture in accordance with an embodiment. For example, FIG. 12A depicts a cross-sectional focused view of a portion of the package substrate of the semiconductor device 100 and FIG. 12B depicts a top-side-up plan view corresponding with FIG. 12A. In this embodiment, an example package substrate 1214 is formed as a build-up redistribution layer (RDL) type package substrate for a fanout type package. The focused view depicted in FIG. 12A and FIG. 12B corresponds to a portion of the package substrate 1214 including conductive traces 1204 and 1206 configured for subsequent formation of a coaxial TPV as provided in FIG. 2 through FIG. 9, for example.

The package substrate 1214 includes conductive features (e.g., traces 1204-1210 and vias 1212) surrounded by non-conductive material 1202 (e.g., dielectric). In this embodiment, portions of the conductive traces 1204 and 1206 of the package substrate 1214 are exposed at the top side of the package substrate. The exposed portions of the conductive traces 1204 and 1206 are configured for connection to a coaxial TPV formed at subsequent stages of manufacture consistent with the stages depicted in FIG. 2 through FIG. 9. In this embodiment, the trace 1204 is configured for subsequent formation of a signal conductor and the surrounding trace 1206 is configured for subsequent formation of a concentric shield conductor of a coaxial TPV. The trace 1204 and the trace 1206 are separated by the non-conductive material 1202 of the package substrate 1214. Conductive connectors 1216 (e.g., solder balls) are affixed at a bottom side of the package substrate 1214. Openings in the non-conductive material 1202 expose portions of traces 1210 configured for attachment of the conductive connectors 1216.

Figure 13B:
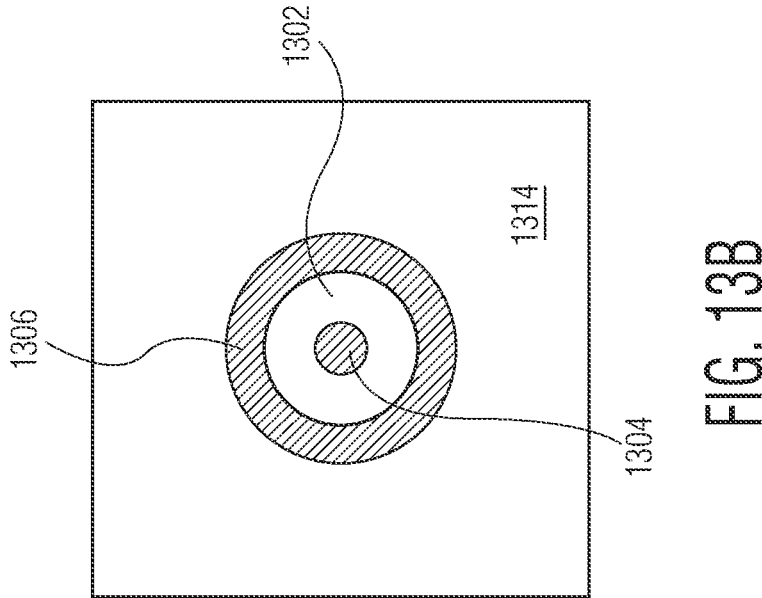
Figure 13A:
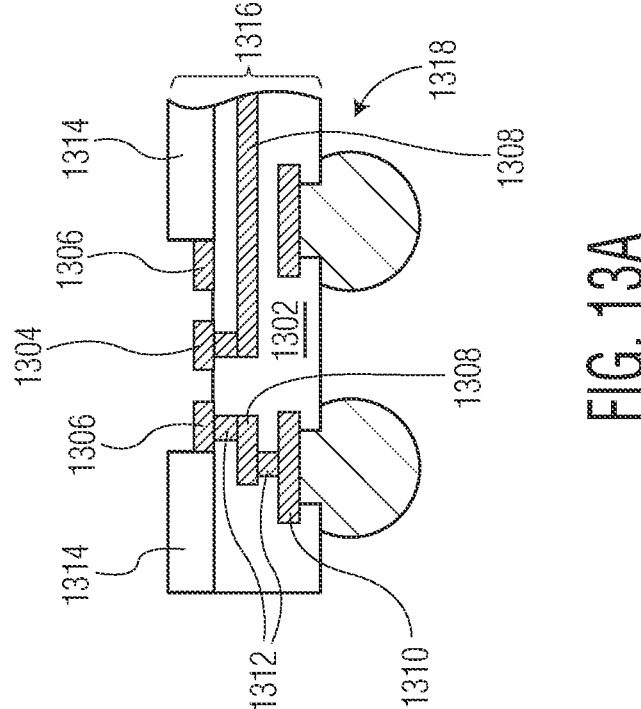

FIG. 13A and FIG. 13B illustrate, in simplified plan and cross-sectional focused views, the example semiconductor device 100 at a stage of manufacture in accordance with an embodiment. For example, FIG. 13A depicts a cross-sectional focused view of a portion of the package substrate of the semiconductor device 100 and FIG. 13B depicts a top-side-up plan view corresponding with FIG. 13A. In this embodiment, an example package substrate 1316 is formed as a laminate type package substrate for a flip-chip chip scale package type. The focused view depicted in FIG. 13A and FIG. 13B corresponds to a portion of the package substrate 1316 including conductive traces 1304 and 1306 configured for subsequent formation of a coaxial TPV as provided in FIG. 2 through FIG. 9, for example.

The package substrate 1316 includes conductive features (e.g., traces 1304-1310 and vias 1312) surrounded by non-conductive material 1302 (e.g., dielectric). In this embodiment, a solder mask material 1314 (e.g., patterned dielectric) is applied at a top side and patterned such that portions of the conductive traces 1304 and 1306 of the package substrate 1316 are exposed at the top side. The exposed portions of the conductive traces 1304 and 1306 are configured for connection to a coaxial TPV formed at subsequent stages of manufacture consistent with the stages depicted in FIG. 2 through FIG. 9. In this embodiment, the trace 1304 is configured for subsequent formation of a signal conductor and the surrounding trace 1306 is configured for subsequent formation of a concentric shield conductor of a coaxial TPV. In this embodiment, the trace 1304 and the trace 1306 are separated by an encapsulant formed at a subsequent stage. Conductive connectors 1318 (e.g., solder balls) are affixed at a bottom side of the package substrate 1316. Openings in the non-conductive material 1302 expose portions of traces 1310 configured for attachment of the conductive connectors 1318.

Figure 14B:
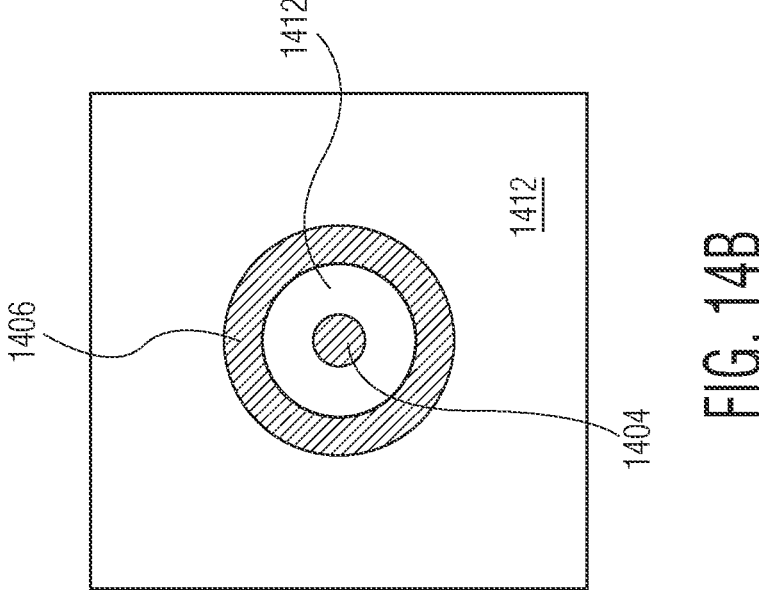
Figure 14A:
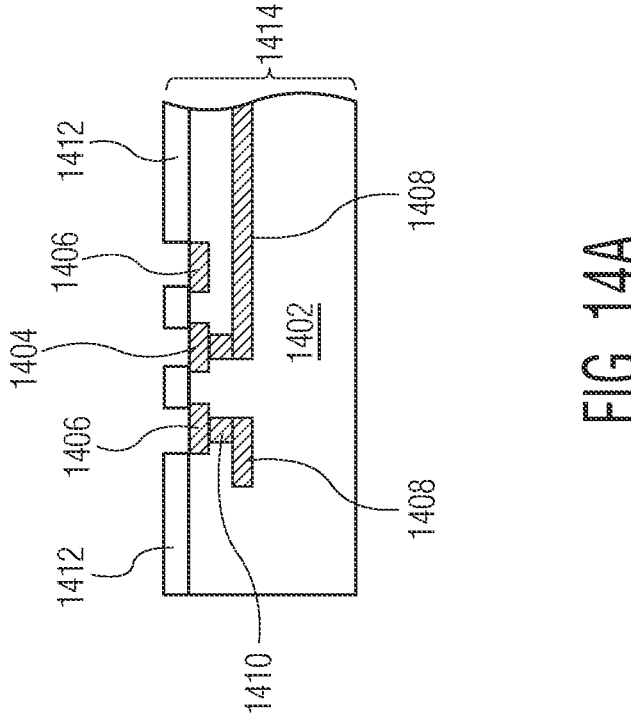

FIG. 14A and FIG. 14B illustrate, in simplified plan and cross-sectional focused views, the example semiconductor devices 1000 and 1100 at a stage of manufacture in accordance with an embodiment. For example, FIG. 14A depicts a cross-sectional focused view of a portion of the semiconductor die of the semiconductor devices 1000 and 1100 (shown in FIG. 10 and FIG. 11) and FIG. 14B depicts a top-side-up plan view corresponding with FIG. 14A. In this embodiment, an example semiconductor die 1414 is configured in an active-side-up orientation. The focused view depicted in FIG. 14A and FIG. 14B corresponds to a portion of the semiconductor die 1414 including die pads 1404 and 1406 configured for subsequent formation of a coaxial TPV as provided in FIG. 10 and FIG. 11, for example.

The semiconductor die 1414 includes conductive features (e.g., die pads 1404 and 1406, traces 1408 and vias 1410) formed at the active side of the bulk substrate 1402 of the semiconductor die 1414. In this embodiment, a final passivation layer 1412 (e.g., dielectric) is applied at a top side and patterned such that portions of the die pads 1404 and 1406 of the semiconductor die 1414 are exposed at the active side. The exposed portions of the die pads 1404 and 1406 are configured for direct connection to a coaxial TPV formed at subsequent stages of manufacture consistent with the embodiments depicted in FIG. 10 and FIG. 11. In this embodiment, the die pad 1404 is configured for subsequent formation of a signal conductor and the surrounding die pad 1406 is configured for subsequent formation of a concentric shield conductor of a coaxial TPV. The die pad 1404 and the die pad 1406 are separated by the non-conductive material of the semiconductor die 1414.

Generally, there is provided, a method of forming a semiconductor device including encapsulating with a first encapsulant at least a portion of a semiconductor die and a package substrate, the first encapsulant including an additive selectively activated by way of a laser; forming a first opening in the first encapsulant, the first opening exposing a predetermined first portion of the package substrate, the additive activated at the sidewalls of the first opening; forming a second opening in the first encapsulant, the second opening encircling the first opening and exposing a predetermined second portion of the package substrate, the additive activated at the sidewalls the second opening; and plating a conductive material on the additive activated portions of the first encapsulant. The conductive material on the additive activated portions of the first encapsulant may include forming a signal conductor in the first opening and a concentric shield conductor in the second opening to form a coaxial through package via. The signal conductor may be interconnected to the semiconductor die by way of a conductive trace of the package substrate. The method may further include patterning a laser ablated path substantially perpendicular to the second opening at a top surface of the first encapsulant, wherein plating the conductive material on the additive activated portions of the first encapsulant includes forming a conductive trace on the laser ablated path connected to the shield conductor. The conductive trace connected to the shield conductor may at least partially overlap the semiconductor die. The method may further include encapsulating with a second encapsulant exposed portions of the signal conductor and the shield conductor and portions of the top surface of the first encapsulant, the second encapsulant including an additive selectively activated by way of a laser. The method may further include forming a first plated conductor in the second encapsulant, the first plated conductor connected to the signal conductor at a first end and exposed at a top surface of the second encapsulant. The method may further include forming a second plated conductor substantially perpendicular to and connected to the first plated conductor at the top surface of the second encapsulant, the second plated conductor configured as a signal launcher or a signal antenna. The encapsulant may be characterized as a low loss tangent material having a dissipation factor (Df) property less than or equal to 0.01.

In another embodiment, there is provided, a method of forming a semiconductor device including encapsulating with a first encapsulant at least a portion of a semiconductor die and a package substrate, the first encapsulant including an additive selectively activated by way of a laser; forming a first opening in the first encapsulant, the first opening exposing a predetermined first portion of the package substrate, the additive activated at the sidewalls of the first opening; plating a first conductive material on the additive activated portions of the first encapsulant; encapsulating with a second encapsulant the first opening and at least a portion of the first encapsulant, the second encapsulant including an additive selectively activated by way of a laser; forming a second opening in the second encapsulant, the second opening exposing a predetermined second portion of the package substrate, the additive activated at the sidewalls of the second opening; and plating a second conductive material on the additive activated portions of the second encapsulant. The second conductive material on the additive activated portions of the second encapsulant may include forming a signal conductor in the second opening and plating the first conductive material on the additive activated portions of the first encapsulant comprises forming a concentric shield conductor in the first opening surrounding the signal conductor to form a coaxial through package via. The signal conductor may be interconnected to the semiconductor die by way of a conductive trace of the package substrate. The method may further include patterning a laser ablated path substantially perpendicular to the second opening at a top surface of the second encapsulant, wherein plating the second conductive material on the additive activated portions of the second encapsulant includes forming a conductive trace on the laser ablated path connected to the signal conductor. The conductive trace connected to the signal conductor may be configured as a signal launcher or a signal antenna. The second encapsulant may be characterized as a low loss tangent material having a dissipation factor (Df) property with a value less than or equal to 0.01.

In yet another embodiment, there is provided, a semiconductor device including a first encapsulant encapsulating at least a portion of a semiconductor die and a package substrate, the first encapsulant including an additive configured for selective activation by way of a laser; a first conductor plated on activated portions of the first encapsulant, the first conductor directly connected to a first die pad at an active side of the semiconductor die; a second encapsulant encapsulating at least a portion of the first conductor and a portion of the active side of the semiconductor die, the first encapsulant including an additive configured for selective activation by way of a laser; and a second conductor plated on activated portions of the second encapsulant, the second conductor directly connected to a second die pad at the active side of the semiconductor die, at least a portion of the second conductor substantially surrounded by the first conductor. The second encapsulant may be configured and arranged to separate the second conductor from the first conductor. The portion of the second conductor substantially surrounded by the first conductor may be characterized as a coaxial via directly connected to the semiconductor die. The second conductor may be characterized as a signal conductor including a vertical portion having a first end connected to the second die pad and a second end extending through the second encapsulant and a horizontal portion connected to the second end, the horizontal portion configured as a signal launcher or a signal antenna. The first conductor may be characterized as a shield conductor including a vertical portion having a first end connected to the first die pad and a second end connected to a horizontal portion, the horizontal portion connected to the package substrate by way of a conductive via formed through the first encapsulant.

By now, it should be appreciated that there has been provided a semiconductor device with a semiconductor device with a coaxial TPV. The semiconductor device includes a semiconductor die and a package substrate at least partially encapsulated with an encapsulant. The encapsulant includes an additive capable of being activated by way of a laser in a laser direct structuring process. Openings are formed using laser ablation thus activating the encapsulant at the sidewalls of the openings. The openings are formed through the encapsulant such that predetermined conductive trace portions of the package substrate are exposed. The semiconductor device is subjected to a plating process which forms a plated signal conductor connected to a first trace in a first opening and a plated concentric shield conductor connected to a second trace in a second opening. The shield conductor is connected to a ground voltage supply terminal and surrounds the signal conductor to form the coaxial TPV connected to traces of the package substrate. By forming the semiconductor device with the coaxial TPV in this manner, low loss RF signal propagation can be realized with lower product costs.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
a package substrate having a top surface;
a semiconductor die coupled to the package substrate and having an active surface, a first die pad at the active surface, and a second die pad at the active surface, wherein the active surface faces away from the top surface of the package substrate;
encapsulant covering at least a portion of the semiconductor die and at least a portion of the top surface of the package substrate, wherein the encapsulant has a top surface, the encapsulant including an additive selectively activated by way of a laser;
a first opening through the encapsulant, wherein the first opening is defined by first sidewalls that extend from the top surface of the encapsulant to the active surface of the semiconductor die, and the first opening exposes the first die pad at the top surface of the semiconductor die;

a vertical signal conductor within the first opening, wherein the vertical signal conductor has a first end coupled to the first die pad;

a second opening through the encapsulant, wherein the second opening is defined by second sidewalls that extend from a top surface of the encapsulant to the top surface of the semiconductor die, the second opening at least partially surrounds the first opening but is separated from the first opening by a portion of the encapsulant, and the second opening exposes the second die pad at the top surface of the semiconductor die; and a shield conductor within the second opening, wherein the shield conductor at least partially surrounds the signal conductor but is separated from the signal conductor by the portion of the encapsulant, and the shield conductor has a first end coupled to the second die pad.

2. The semiconductor device of claim 1, further comprising a conductive radio frequency radiating element on a first surface of the encapsulant, wherein the conductive radio frequency radiating element extends perpendicular from and is electrically coupled to the signal element.

3. The semiconductor device of claim 1, wherein the encapsulant comprises:

a first encapsulant covering the semiconductor die and the at least a portion of the top surface of the package substrate, wherein the second opening extends through the first encapsulant; and a second encapsulant within the first opening between the shield conductor and the signal conductor and overlying an upper surface of the first encapsulant, wherein the first opening extends through the second encapsulant.

4. The semiconductor device of claim 3, further comprising:

a conductive shield on a surface of the first encapsulant, wherein the conductive shield is electrically coupled to the shield conductor; and a conductive radio frequency radiating element on a surface of the second encapsulant, wherein the conductive radio frequency radiating element is electrically coupled to the signal conductor, and the conductive radio frequency radiating element overlaps at least a portion of the conductive shield.

5. The semiconductor device of claim 4, wherein the package substrate further includes:

a conductive trace at the top surface of the package substrate, wherein the conductive trace electrically couples the conductive shield and a connector at a bottom surface of the package substrate.

6. A semiconductor device comprising:

a package substrate having a top surface, a first trace at the top surface, and a second trace at the top surface;

a semiconductor die coupled to the package substrate and having an active surface and a die pad at the active surface, wherein the active surface faces the top surface of the package substrate, and the die pad is electrically coupled to the first trace of the package substrate;

encapsulant covering at least a portion of the semiconductor die and at least a portion of the top surface of the package substrate, wherein the encapsulant has a top surface, the encapsulant including an additive selectively activated by way of a laser;

a first opening through the encapsulant, wherein the first opening is defined by first sidewalls that extend from the top surface of the encapsulant to the top surface of the package substrate, and the first opening exposes the first trace at the top surface of the package substrate;

a vertical signal conductor within the first opening, wherein the vertical signal conductor has a first end coupled to the first trace;

a second opening through the encapsulant, wherein the second opening is defined by second sidewalls that extend from a top surface of the encapsulant to the top surface of the package substrate, the second opening at least partially surrounds the first opening but is separated from the first opening by a portion of the encapsulant, and the second opening exposes the second trace at the top surface of the package substrate; and a shield conductor within the second opening, wherein the shield conductor at least partially surrounds the signal conductor but is separated from the signal conductor by the portion of the encapsulant, and the shield conductor has a first end coupled to the second trace.

7. The semiconductor device of claim 6, wherein the encapsulant comprises:

a first encapsulant covering the semiconductor die and the at least a portion of the top surface of the package substrate, wherein the second opening extends through the first encapsulant; and a second encapsulant within the first opening between the shield conductor and the signal conductor and overlying an upper surface of the first encapsulant, wherein the first opening extends through the second encapsulant.

8. The semiconductor device of claim 6, wherein the encapsulant comprises:

a first encapsulant covering the semiconductor die and the at least a portion of the top surface of the package substrate, wherein the first and second openings extend through the first encapsulant;

a second encapsulant overlying an upper surface of the first encapsulant; and a third trace extending through the second encapsulant to contact the vertical signal conductor; and a conductive radio frequency radiating element on a surface of the second encapsulant, wherein the conductive radio frequency radiating element extends perpendicular from and is electrically coupled to the third trace.

9. The semiconductor device of claim 6, further comprising a conductive radio frequency radiating element on a first surface of the encapsulant, wherein the conductive radio frequency radiating element extends perpendicular from and is electrically coupled to the signal element.

10. The semiconductor device of claim 9, further comprising a conductive shield on a second surface of the encapsulant, wherein the conductive shield is electrically coupled to the shield conductor, and the conductive radio frequency radiating element overlaps at least a portion of the conductive shield.

11. The semiconductor device of claim 6, wherein the package substrate further includes:

a third conductive trace that electrically couples the first trace of the package substrate and the die pad of the semiconductor die; and a fourth conductive trace that electrically couples the second trace of the package substrate and a connector at a bottom surface of the package substrate.

* * * * *